(12) United States Patent
Teong et al.

(10) Patent No.: US 6,864,956 B1
(45) Date of Patent: Mar. 8, 2005

(54) DUAL PHASE GRATING ALIGNMENT MARKS

(75) Inventors: Lim Chin Teong, Penang (MY); Li Kuo Wei, Penang (MY); Jeong Soo Kim, Buk Ku Kwang Ju (KR); Zadig Lam, Singapore (SG)

(73) Assignee: SilTerra Malaysia Sdn. Bhd. (MY)

( * ) Notice: Subject to any disclaimer, the term of this patent is extended or adjusted under 35 U.S.C. 154(b) by 0 days.

(21) Appl. No.: 10/394,414

(22) Filed: Mar. 19, 2003

(51) Int. Cl.[7] .................. G03B 27/42; G03B 27/54; G01B 11/00; G01B 11/02
(52) U.S. Cl. .................. 355/53; 355/67; 356/401; 356/508
(58) Field of Search .................. 355/53, 67, 72, 355/77; 356/399, 400, 401, 508, 521, 494; 250/559.3, 548

(56) References Cited

U.S. PATENT DOCUMENTS

| | | |
|---|---|---|
| 5,716,889 A | 2/1998 | Tsuji et al. |
| 6,228,743 B1 | 5/2001 | Chen et al. |
| 6,235,437 B1 | 5/2001 | Neoh et al. |
| 6,239,031 B1 | 5/2001 | Kepler et al. |
| 6,288,454 B1 | 9/2001 | Allman et al. |
| 6,297,876 B1 * | 10/2001 | Bornebroek .................. 355/67 |
| 6,352,904 B2 | 3/2002 | Tan et al. |
| 6,452,662 B2 | 9/2002 | Mulkens et al. |
| 2002/0080365 A1 * | 6/2002 | Monshouwer et al. ....... 356/508 |

OTHER PUBLICATIONS

Navarro, R. et al. (2001). "Extended Athena Alignment Performance and Application for the 100 NM Technology Node," SPIE, The 26th Annual International Symposium on Microlithography, Feb. 25–Mar. 2, 2001, 1–10.

* cited by examiner

Primary Examiner—Peter B. Kim
(74) Attorney, Agent, or Firm—Townsend and Townsend and Crew LLP

(57) ABSTRACT

A method for aligning a substrate on a lithographic apparatus includes providing a substrate having a first plurality of grating marks optimized for a beam of a first given diffraction order and a second plurality of grating marks optimized for a beam of a second given diffraction order on a lithographic apparatus. A first signal is generated using a first beam reflected from the first grating marks, the first beam being a beam of the first given diffraction order. A second signal is generated using a second beam reflected from the second grating marks, the second beam being a beam of the second given diffraction order. The substrate is aligned with respect to the apparatus using the first and second signals.

21 Claims, 5 Drawing Sheets

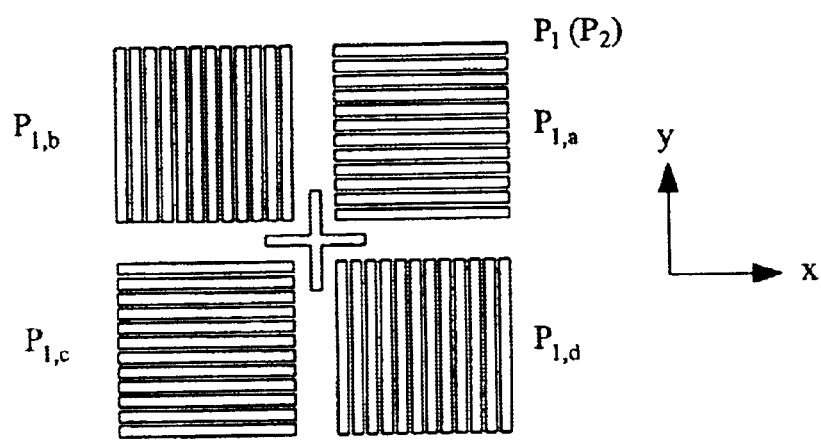
FIG. 2
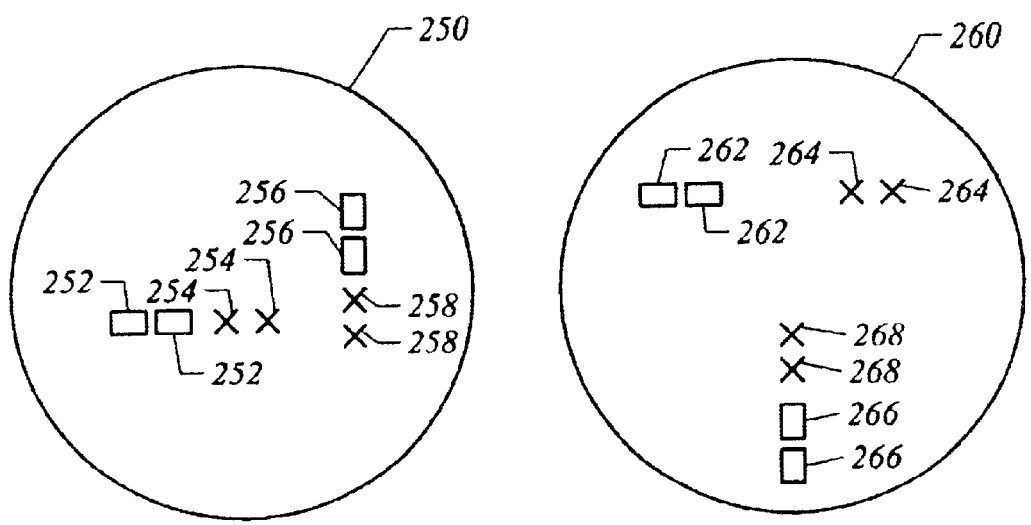
FIG. 4A  FIG. 4B

DUAL PHASE GRATING ALIGNMENT MARKS

BACKGROUND OF THE INVENTION

The present invention relates to a substrate alignment system and method thereof. The substrate alignment system is commonly used in a lithographic projection apparatus (or wafer stepper) in fabricating semiconductor devices. One of the function of the stepper is to "print" electronic circuit information onto a substrate by lithographic techniques. The lithographic projection apparatus may be a stepping apparatus or a step-and-scan apparatus.

In a stepping apparatus, the mask pattern is imaged in one run on an integrated circuit ("IC") area of the substrate. Subsequently, the substrate is moved with respect to the mask in such a way that a subsequent IC area will be situated under the mask pattern and the projection lens system and the mask pattern is imaged on the subsequent IC area. This process is repeated until all IC areas of the substrate are provided with a mask pattern image.

In a step-and-scan apparatus, the above-mentioned stepping procedure is also followed, but the mask pattern is not imaged in one run but via scanning movement. During imaging of the mask pattern, the substrate is moved synchronously with the mask with respect to the projection system and the projection beam, taking the magnification of the projection system into account. A series of juxtaposed partial images of consecutively exposed parts of the mask pattern is imaged in an IC area. After the mask pattern has been completely imaged in an IC area, a step is made to a subsequent IC area. Currently, the step-and-scan apparatus is more widely used in the semiconductor industries since scanning uses the lens more effectively than static exposure of the entire area. An example of a step-and-scan apparatus is described in U.S. Pat. Nos. 6,452,662 and 6,297,876, which are incorporated by reference. A method of using a scan-step system is described in, "Extended ATHENA™ Alignment Performance and Application for the 100 NM Technology Node," by Ramon Navarro et al., of ASML, De Run 1110, 5503 LA Veldhoven, The Netherlands, presented at SPIE, the 26th Annual International Symposium on Microlithography, Feb. 25–Mar. 2, 2001, Santa, Clara, Calif., which is incorporated by reference.

Some of the important considerations in lithography are (1) critical dimension ("CD") control or imaging, and (2) overlay. The CD control defines how accurately the line width of structures formed on the substrate can be controlled. The CD control strongly influences the final performance, e.g., speed and power, of the semiconductor devices that have been fabricated. The overlay relates to the repositioning accuracy of successive exposures. Since the circuitry is patterned onto the substrate by repeatedly exposing the substrate to light and processing it layer-by-layer, it is important that the substrate is positioned at nearly the same position as in the previous processes. Accordingly, the overlay strongly influences the density of semiconductor devices that may be fabricated. Various types of alignment marks are used to properly align the substrate with minimum overlay.

BRIEF SUMMARY OF THE INVENTION

In one embodiment, a method for aligning a substrate on a lithographic apparatus includes providing a substrate having a first plurality of grating marks optimized for a beam of a first given diffraction order and a second plurality of grating marks optimized for a beam of a second given diffraction order on a lithographic apparatus. A first signal is generated using a first beam reflected from the first grating marks, the first beam being a beam of the first given diffraction order. A second signal is generated using a second beam reflected from the second grating marks, the second beam being a beam of the second given diffraction order. The substrate is aligned with respect to the apparatus using the first and second signals.

In another embodiment, a method for processing a substrate includes providing a substrate having a first plurality of phase grating marks optimized for a beam of first given diffraction order and a second plurality of phase grating marks optimized for a beam of second given diffraction order on a process apparatus; generating a first signal using a first beam reflected from the first grating marks, the first beam being a beam of the first given diffraction order; generating a second signal using a second beam reflected from the second grating marks, the second beam being a beam of the second given diffraction order; and performing a first alignment of the substrate with respect to a first component of the process apparatus using the first and second signals.

In yet another embodiment, a substrate configured for being processed by a lithographic projection apparatus includes a first plurality of phase grating marks optimized for a beam of first given diffraction order; a second plurality of phase grating marks optimized for a beam of second given diffraction order; a third plurality of phase grating marks optimized for a beam of the first given diffraction order; and a fourth plurality of phase grating marks optimized for a beam of the second given diffraction order, wherein the first and second marks are used for aligning the substrate along a first axis, and the third and fourth marks are used for aligning the substrate along a second axis.

BRIEF DESCRIPTION OF THE DRAWINGS

FIG. 2 illustrates exemplary grating marks that may be provided on a substrate to align the substrate with respect to the lithographic projection apparatus according to one embodiment of the present invention.

FIG. 4A illustrates a substrate that is provided with a plurality of grating marks according to one embodiment of the present invention.

FIG. 4B illustrates a substrate that is provided with a plurality of grating marks according to another embodiment of the present invention.

DETAILED DESCRIPTION OF THE INVENTION

Figure 1:
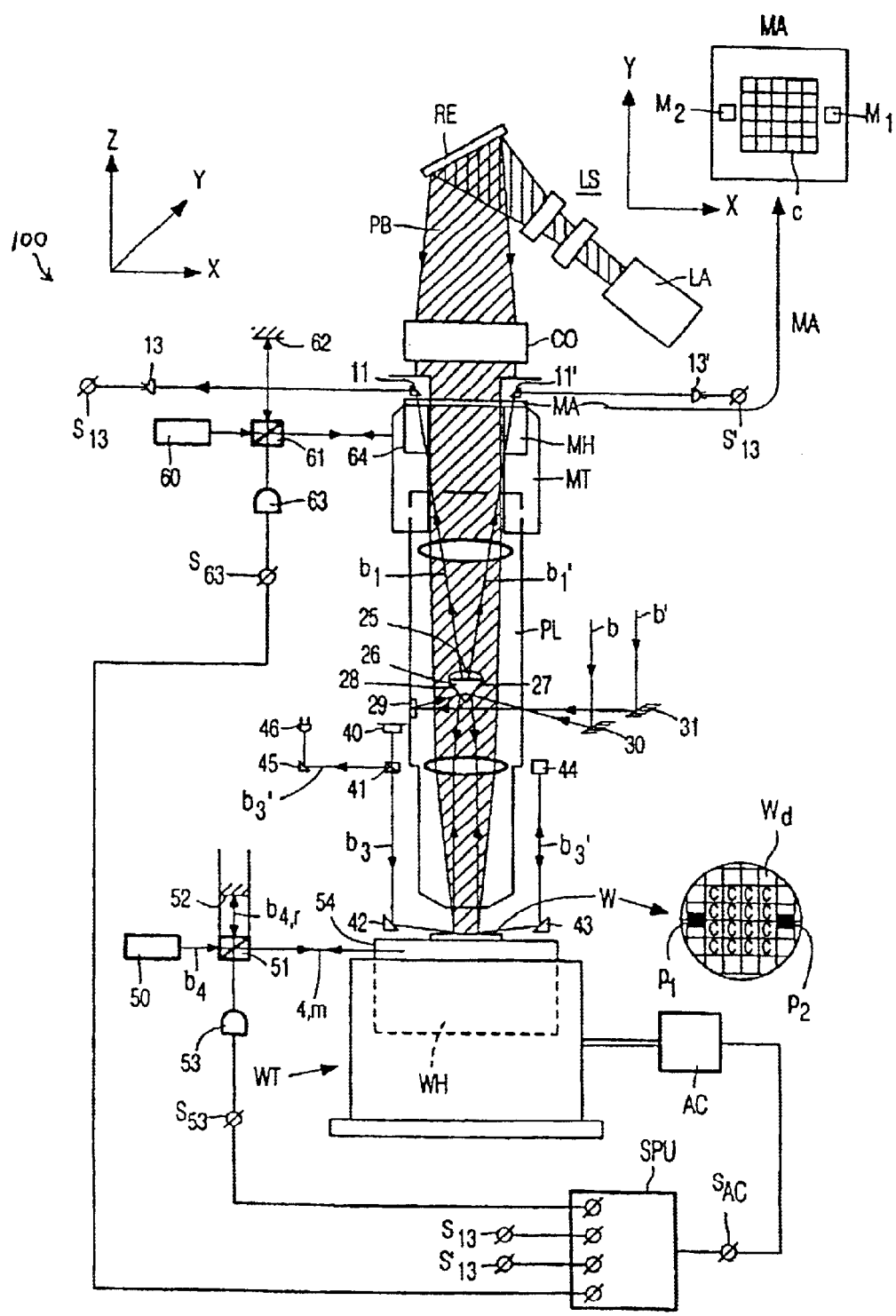
FIG. 1 illustrates a lithographic projection apparatus that is used to pattern a substrate according to one embodiment of the present invention.

FIG. 1 depicts a lithographic projection apparatus 100 according to one embodiment of the present invention. The apparatus 100 is a step-and-scan apparatus. This apparatus includes a projection column incorporating a projection system PL. Situated above this system is a mask holder MH for a mask MA in which the mask pattern C to be imaged is provided. The mask holder is part of a mask table MT. A substrate table WT is arranged below the projection lens system PL and includes a substrate holder WH for a substrate W that is provided with a photosensitive layer. The mask pattern C must be imaged a number of times in the photosensitive layer, every time in a different area, an IC area $W_d$. The substrate table is movable in the X and Y directions, so that after imaging the mask pattern in a first IC area, a subsequent IC area can be positioned under the mask pattern.

The apparatus 100 further comprises an illumination system having a radiation source LA, for example a Krypton-Fluoride Excimer laser or a mercury lamp, a lens system LS, a mirror RE and a condenser lens CO. The projection beam PB supplied by the illumination system illuminates the mask pattern C. This pattern is imaged by the projection lens system PL on an IC area of the substrate W. The projection lens system has, for example, a magnification M=¼, a numerical aperture NA=0.6 and a diffraction-limited image field with a diameter of 22 mm.

The apparatus 100 further includes a number of measuring systems, namely a system for aligning the mask MA and the substrate W with respect to each other in the X-Y plane, an interferometer system for determining the position and orientation of the substrate holder and hence of the substrate, and a focus error detection system for determining a difference between the focal or image plane of the projection lens system PL and the surface of the substrate W. These measuring systems are parts of servo systems which comprise electronic signal-processing and control circuits and drivers, or actuators, with which the position and orientation of the substrate and the focusing can be corrected with reference to the signals supplied by the measuring systems.

The on-axis alignment system makes use of two alignment marks $M_1$ and $M_2$ in the mask MA shown in the top right part of FIG. 1. These marks preferably consist of diffraction gratings but may be alternatively constituted by other marks such as squares or strips which are optically distinguished from their surroundings (see, FIG. 2). The alignment marks are preferably two-dimensional, i.e., they extend in two mutually perpendicular directions, the X and Y directions in FIG. 1. As understood by those skilled in the art, the apparatus 100 may be modified for use with an off-axis alignment system.

The substrate W, for example a semiconductor substrate, has at least two alignment marks, preferably also two-dimensional diffraction gratings, two of which, $P_1$ and $P_2$, are shown in FIG. 1. These marks are situated outside the IC areas on the substrate W according to one embodiment of the present invention. The grating marks $P_1$ and $P_2$ are preferably implemented as phase gratings and the grating marks $M_1$ and $M_2$ are preferably implemented as amplitude gratings.

In one embodiment, the apparatus 100 uses an on-axis alignment unit that is a double alignment unit, in which two alignment beams b and b' are used for aligning the substrate alignment mark $P_2$ on the mask alignment mark $M_2$, and for aligning the substrate alignment mark $P_1$ on the mask alignment mark $M_1$, respectively. In another embodiment, the apparatus 100 uses an off-axis alignment system. An example of an alignment system that may be used to implement the present embodiments is ATHENA™, provided by ASML of Netherlands.

Referring back to the alignment method, the beam b is reflected by a reflecting element 30, e.g., a mirror, towards the reflecting surface 27 of a prism 26. The surface 27 reflects the beam b towards the substrate alignment mark $P_2$ which sends a part of the radiation as beam $b_1$ to the associated mask mark M where an image of the mark $P_2$ is formed. A reflecting element 11 is situated above the mark $M_{.2}$. The reflecting element 11, e.g., a prism, directs the radiation passed by the mark $M_{.2}$ towards a radiation-sensitive detector 13.

The second alignment beam b' is reflected by a mirror 31 towards a reflector 29 in the projection lens system PL. This reflector sends the beam b' to a second reflecting surface 28 of the prism 26, which directs the beam b' onto the substrate alignment mark $P_1$. This mark reflects a part of the radiation of the beam b' as beam $b'_1$ to the mask alignment mark $M_1$ where an image of the mark $P_1$ is formed. The radiation of the beam $b'_1$ passing through the mark $M_1$ is directed by a reflector 11' towards a radiation-sensitive detector 13'.

FIG. 2 shows exemplary alignment marks, in the form of phase gratings. Such a grating may consist of four sub-gratings $P_{1,a}$, $P_{1,b}$, $P_{1,c}$ and $P_{1,d}$. The marks $P_{1,b}$ and $P_{1,d}$ are used for X direction alignment, and the marks $P_{1,a}$ and $P_{1,c}$ are used for Y direction alignment. The two sub-gratings $P_{1,b}$ and $P_{1,c}$ have a grating period of about 16 μm, and the sub-gratings $P_{1,a}$ and $P_{1,d}$ have a grating period of about 17.6 μm. Each sub-grating may have a dimension of, for example 200×200 μm. An alignment accuracy which, in principle, is smaller than 0.1 μm can be achieved with this grating mark and a suitable optical system. The capture range of the alignment unit can be enlarged by choosing different grating periods. This range is about 40 μm. Additional examples and information on the alignment marks and methods are disclosed in U.S. Pat. Nos. 6,228,743, 6,235,437, 6,239,031, and 5,716,889, which are all incorporated by reference.

Figure 3:
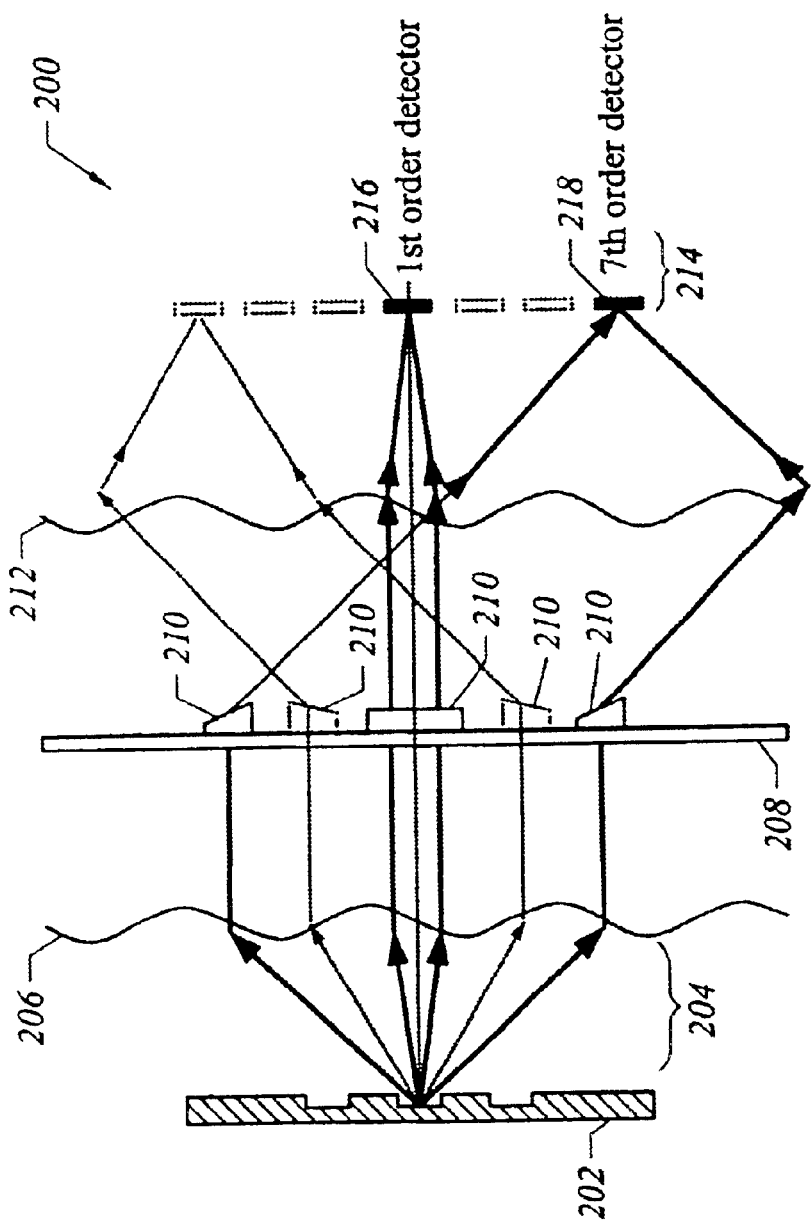
FIG. 3 illustrates an alignment system that is used to align a substrate with respect to the lithographic projection apparatus according to one embodiment of the present invention.

FIG. 3 illustrates the use of alignment marks in an off-axis alignment system 200. A wafer 202 with alignment marks reflect beams 204 to a first lens system 206 that collimates the beams 204. The beams 204 includes sub-beams of various diffraction orders. For example, the sub-beams of the first orders b(+1) and b(−1) and the sub-beams of the seventh order b(+7) and b(−7) are illustrated in FIG. 3 as exemplary beams. The reflected beams are directed from the first lens system 206 to a wedge 208 having a plurality of deflection elements 210. The deflection elements are provided with appropriate angles to direct the beams to different areas of a second lens system 212. The second lens system 212 then directs the beams to a beam detection system 214, so that the sub-beams of various orders are directed to appropriate detectors in the detection system. For example, the first order sub-beam is directed to a first detector 216 that is configured to receive the first order sub-beams, and the seventh order sub-beam is directed to a second detector 218 that is configured to receive the seven order sub-beams. These sub-beams are processed using a multi-axis interferometer system to accurately determine the X and Y positions. Exemplary interferometer systems are described in U.S. Pat. Nos. 4,251,160 and 4,737,283, which are incorporated by reference.

FIG. 4A illustrates a substrate 250 having a plurality of alignment marks 252–258 (or phase grating marks) according to one embodiment of the present invention. The marks 252 and 254 are used for determining X position. The marks 252 are configured specifically for use in connection with a sub-beam of first given order (e.g., 1st order), and the marks 254 are configured specifically for use in connection with a sub-beam of second given order (e.g., 7th order). The grating marks are generally optimally configured for a particular diffraction order, e.g., 1st order, 5th order, or 7th order, so that signals having higher amplitudes can be obtained by using the beams of that particular diffraction order. Generally, the pitch of the grating marks is inverse proportional to the diffraction order of the sub-beam for which the grating marks are configured. Accordingly, the grating marks that are optimized for theist order beam tends to have a smaller pitch than those that are optimized for the 7th order beam.

The marks 256 and 258 are used for determining Y position. The marks 256 are configured specifically for use in connection with a sub-beam of first given order (e.g., 1st order), and the marks 258 are configured specifically for use in connection with a sub-beam of second given order (e.g., 7th order). As with the marks 252 and 254, the pitch of the grating marks 256 and 258 is inverse proportional to the diffraction order of the sub-beam for which the grating marks are configured.

The present embodiment uses two different types of grating marks that are optimized for different diffraction order beams in order to more accurately determine the X and Y positions. In one implementation, a first type of grating marks, i.e., the marks 252 or 256, are optimized for the 1st order beams, and a second type of grating marks, i.e., the marks 254 or 258, are optimized for the 3rd, 5th, 7th, or higher order beams. An example of the first grating marks is an ATHENA Scribe Lane Primary Mark ("SPM") type of ASML of Netherlands, which is optimized for the 1st order beams. An example of the second grating marks is AH53, a type of Segmented SPM of ASML, having 3 spaces and 2 lines, which is optimized for a higher order beam. A substrate having the two different types of grating marks facilitates generation of strong signals using beams of two different diffraction orders for which the grating marks are optimized.

In comparison, a substrate having only one type of grating marks generates a strong signal only for the beam of a diffraction order for which the marks have been optimized while generating a weaker signal for the beam of another diffraction order for which the marks have not been optimized.

FIG. 4B illustrate a substrate 260 includes a plurality of marks 262–268 according to another embodiment of the present invention. The marks 262 and 264 are used for determining X position. The marks 266 and 268 are used for determining Y position. As illustrated in FIGS. 4A and 4B, these marks may be provided in various different locations on the substrate.

Figure 5:
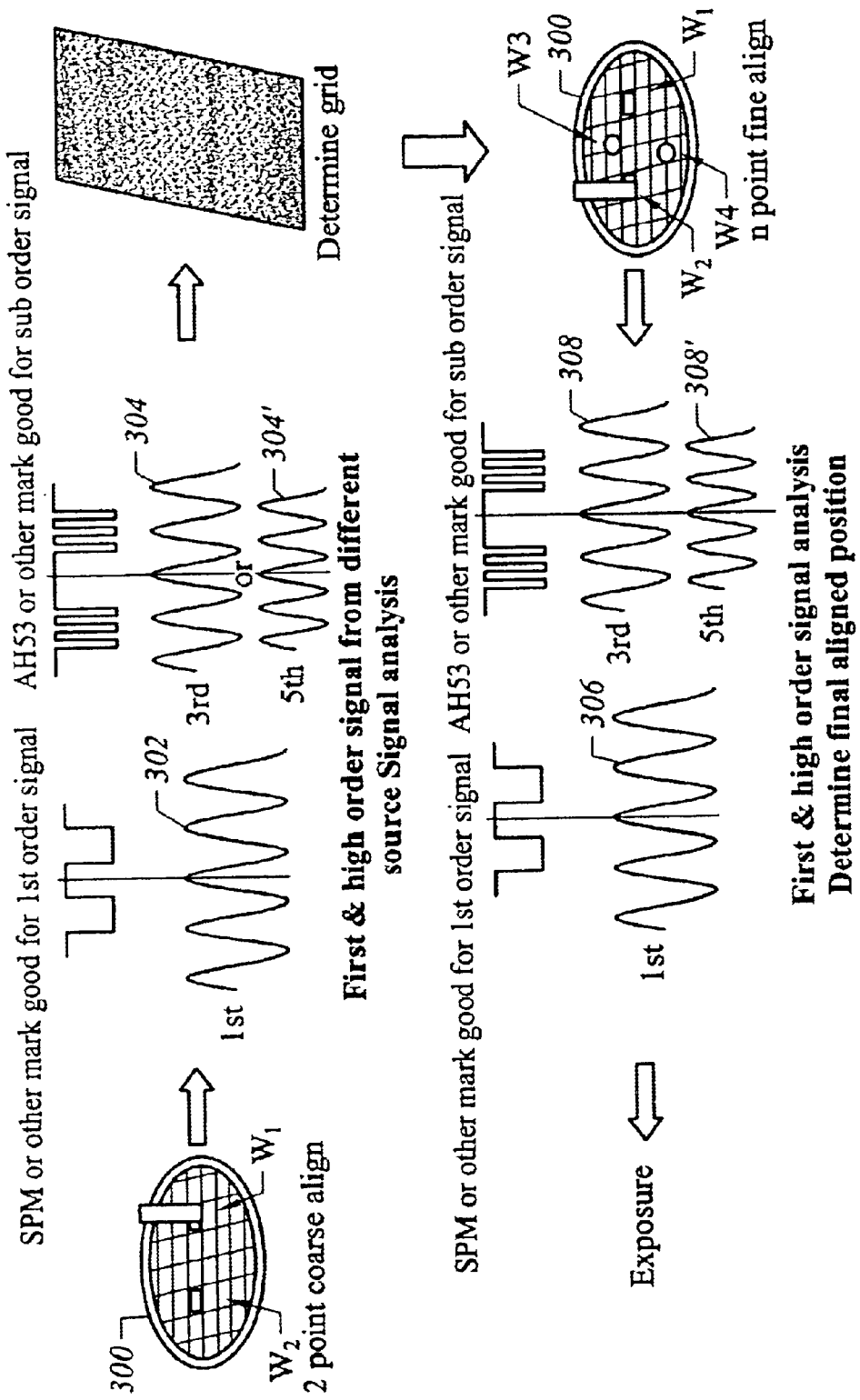
FIG. 5 illustrates a method of aligning a substrate with respect to a lithographic projection apparatus for patterning the substrate according to one embodiment of the present invention.

Referring to FIG. 5, the substrate alignment is performed in a lithographic projection apparatus using a plurality of marks of first and second types according to one embodiment of the present invention. The substrate is aligned in X-Y plane with respect to a certain part of the lithographic apparatus, e.g., a lens of the apparatus. A coarse alignment is first performed on a substrate 300 that is provided on the lithographic apparatus 100. The coarse alignment is performed using a first signal 302 generated by the alignment system 200 using the first grating marks and a second signal 304 or 304' generated by the second grating marks. The signals are generated by the detection system 214 of the alignment system 200 according to one embodiment of the present invention. After the coarse alignment, i.e., the determination of a grid, a fine alignment is performed using a third signal 306 using the first grating marks and a fourth signal 308 or 308' generated by the second grating marks.

Thereafter, the substrate is exposed to light to perform the lithography. The method and system of calculating a substrate position using beams of two different diffraction order are well known in the art so will not be further explained.

In one embodiment, the first grating marks are optimized for 1st order beams, the second grating marks are optimized for 3rd order beams. In another embodiment, the first grating marks are optimized for 1st order beams, and the second grating marks are optimized for 5th order beams.

Figure 6A:
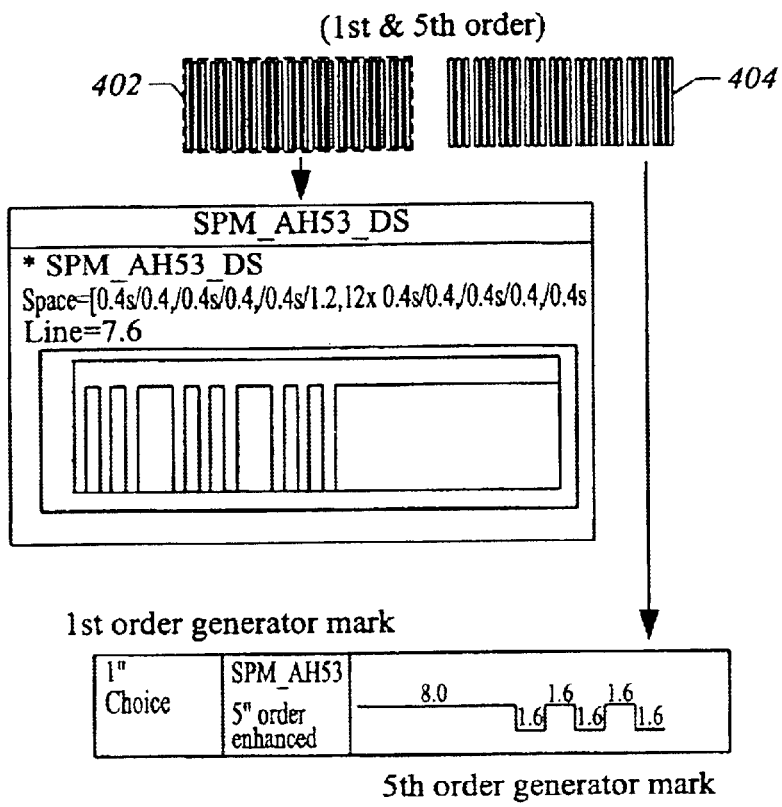
FIG. 6A illustrates a plurality of grating marks optimized for beams of first and fifth orders according to one embodiment of the present invention.

FIG. 6A illustrates a mark type 402 that is optimized for 1st order beams and a mark type 404 that is optimized for 5th order beams. That is, the mark types comprise two types of marks that are optimized for two different beam orders and that are used together to perform a coarse or fine alignment, or both.

Figure 6B:
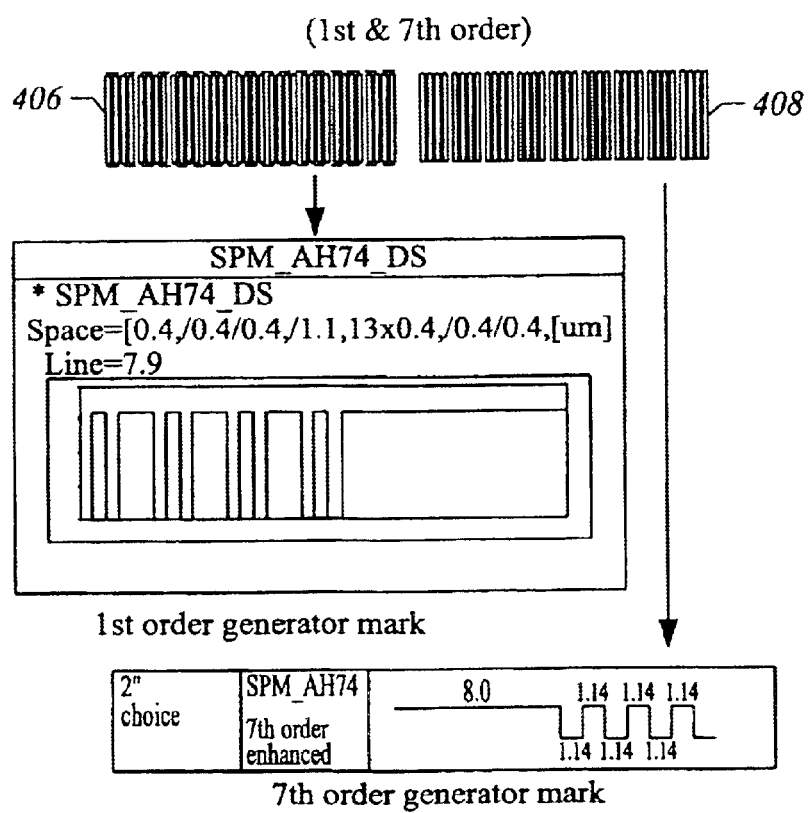
FIG. 6B illustrates a plurality of grating marks optimized for beams of first and seventh orders according to one embodiment of the present invention.

FIG. 6B illustrates a mark type 406 that is optimized for 1st order beams and a mark type 408 that is optimized for 7th order beams. That is, as before, the mark types comprise two types of marks that are optimized for two different beam orders and that are used together to perform a coarse or fine alignment, or both.

While the foregoing is directed to certain preferred embodiments of the present invention, other and further embodiments of the invention may be devised without departing from the basic scope of the invention. For example, a plurality of grating marks of first, second, and third types that are optimized for beams of three different diffraction order may be used to align the substrate. This alternative along with other alternatives and equivalents are intended to be included within the scope of the present invention.

What is claimed is:

1. A method for aligning a substrate on a lithographic apparatus, the method comprising:

providing a substrate having a first plurality of grating marks optimized for a beam of a first given diffraction order and a second plurality of grating marks optimized for a beam of a second given diffraction order on a lithographic apparatus;

generating a first signal using a first beam reflected from the first grating marks, the first beam being a beam of the first given diffraction order;

generating a second signal using a second beam reflected from the second grating marks, the second beam being a beam of the second given diffraction order; and aligning the substrate with respect to the apparatus using the first and second signals.

2. The method of claim 1, wherein the aligning step involves moving the substrate.

3. The method of claim 1, wherein the aligning step involves moving the lens of the apparatus.

4. The method of claim 1, wherein the aligning step involves moving both the substrate and the lens.

5. The method of claim 1, further comprising:

generating a third signal using a third beam reflected from the first grating marks, the third beam being a beam of the first given diffraction order;

generating a fourth signal using a fourth beam reflected from the second gating marks, the fourth beam being a beam of the second given diffraction order;

aligning the substrate with respect to the apparatus using the third and fourth signals; and exposing light to the substrate, wherein the first and second grating marks are used for aligning the substrate along a first axis.

6. The method of claim 1, wherein the first grating marks are optimized for a beam of first order, and the second grating marks are optimized for a beam of third order or higher.

7. The method of claim 1, wherein the first grating marks are optimized for a beam of first order, and the second grating marks are optimized for a beam of fifth order or higher.

8. The method of claim 1, wherein the first grating marks are optimized for a beam of first order, and the second grating marks are optimized for a beam of seventh order or higher.

9. A method for processing a substrate, the method comprising:

provcertifiing a substrate having a first plurality of phase grating marks optimized for a beam of first given diffraction order and a second plurality of phase grating marks optimized for a beam of second given diffraction order on a process apparatus;

generating a first signal using a first beam reflected from the first grating marks, the first beam being a beam of the first given diffraction order;

generating a second signal using a second beam reflected from the second grating mark, the second beam being a beam of the second given diffraction order; and performing a first alignment of the substrate with respect to a first component of the process apparatus using the first and second signals.

10. The method of claim 9, wherein the first aligning step involves moving the substrate or a second component of the apparatus, or both.

11. The method of claim 9, wherein the apparatus is a lithographic apparatus.

12. The method of claim 9, further comprising:

performing a second alignment of the substrate with respect to the first component of the process apparatus.

13. The method of claim 12, further comprising:

generating a third signal using a third beam reflected from the first grating marks, the third beam being a beam of the first given diffraction order; and generating a fourth signal using a fourth beam reflected from the second grating marks, the fourth beam being a beam of the second given diffraction order, wherein the second alignment step is performed using the third and fourth signals.

14. The method of claim 13, wherein the first and second phase grating marks are used for aligning the substrate along a first axis.

15. The method of claim 14, wherein the first axis is X or Y axis.

16. The method of claim 13, wherein the substrate further includes a third plurality of phase grating marks optimized for a beam of the first given diffraction order and a fourth plurality of phase grating marks optimized for a beam of the second given diffraction order, where the third and fourth phase grating marks are used for aligning the substrate along a second axis that is different from the first axis.

17. The method of claim 16, wherein the first axis is orthogonal to the second axis.

18. The method of claim 16, wherein the first given diffraction order is a first diffraction order, and the second given diffraction order is a diffraction order higher an the first diffraction order.

19. The method of claim 9, wherein the first alignment step involves coarse alignment, and a second alignment step involves fine alignment.

20. A substrate configured for being processed by a lithographic projection apparatus, the substrate comprising:

a first plurality of phase grating marks optimized for a beam of first given diffraction order;

a second plurality of phase grating marks optimized for a beam of second given diffraction order;

a third plurality of phase grating marks optimized for a beam of the first given diffraction order; and a fourth plurality of phase grating marks optimized for a beam of the second given diffraction order, wherein the first and second marks are used for aligning the substrate along a first axis, and the third and fourth marks are used for aligning the substrate along a second axis.

21. A method for aligning a substrate on a lithographic apparatus, the method comprising:

providing a substrate having a first grating mark optimized for a beam of a first given diffraction order and a second grating mark optimized for a beam of a second given diffraction order on a lithographic apparatus;

generating a first signal using a first beam reflected from the first grating mark, the first beam being a beam of the first given diffraction order;

generating a second signal using a second beam reflected from the second grating mark, the second beam being a beam of the second given diffraction order; and aligning the substrate with respect to the apparatus using the first and second signals.

\* \* \* \* \*